(12) United States Patent
Schmidt et al.

(10) Patent No.: US 11,033,976 B1
(45) Date of Patent: Jun. 15, 2021

(54) SOLDERING FIXTURE

(71) Applicant: VIASAT, INC., Carlsbad, CA (US)

(72) Inventors: Paul J. Schmidt, San Diego, CA (US); Herald J. Artaud, San Diego, CA (US); Timothy G. Romley, Carlsbad, CA (US); David J. Harrell, Oceanside, CA (US)

(73) Assignee: VIASAT, INC., Carlsbad, CA (US)

( * ) Notice: Subject to any disclaimer, the term of this patent is extended or adjusted under 35 U.S.C. 154(b) by 313 days.

(21) Appl. No.: 16/383,025

(22) Filed: Apr. 12, 2019

Related U.S. Application Data

(60) Provisional application No. 62/657,559, filed on Apr. 13, 2018.

(51) Int. Cl.
*B23K 37/04* (2006.01)
*B23K 3/08* (2006.01)
*H01R 43/20* (2006.01)

(52) U.S. Cl.
CPC ........... *B23K 3/087* (2013.01); *H01R 43/205* (2013.01)

(58) Field of Classification Search
CPC ............ B23K 3/087; B23K 37/04–047; H01R 43/205
USPC ............. 228/212–213, 44.3, 44.7, 49.1, 49.5
See application file for complete search history.

(56) References Cited

U.S. PATENT DOCUMENTS

| | | | |
|---|---|---|---|
| 4,583,674 A * | 4/1986 | Dines ..................... | B23K 3/063 228/10 |
| 5,377,897 A * | 1/1995 | Zimmer ................... | G12B 5/00 228/106 |
| 5,441,194 A * | 8/1995 | Nishimura ........... | B23K 20/023 228/42 |
| 5,626,280 A * | 5/1997 | Ciambrone .......... | B23K 1/0053 228/180.21 |
| 5,666,721 A * | 9/1997 | Sakemi ................ | H05K 3/3405 29/843 |
| 5,681,174 A * | 10/1997 | Correll, Jr. ........... | H01R 43/205 439/135 |
| 5,730,630 A * | 3/1998 | Lacourse ............. | H01R 43/205 228/49.5 |
| 6,241,141 B1 | 6/2001 | Al-Nabulsi | |
| 6,799,714 B2 * | 10/2004 | Gleason ............. | H05K 13/0069 228/212 |

(Continued)

FOREIGN PATENT DOCUMENTS

| | | | | | |
|---|---|---|---|---|---|
| EP | 0373910 A1 * | 6/1990 | ............. | B25B 5/103 |
| JP | 06048477 A * | 2/1994 | ............. | H01R 12/57 |

*Primary Examiner* — Kiley S Stoner
(74) *Attorney, Agent, or Firm* — Tarolli, Sundheim, Covell & Tummino LLP

(57) ABSTRACT

A soldering fixture for coupling surface-mount leads of an edge connector to corresponding pads on a PCB includes a base for positioning over the edge connector. A threaded mounting shaft is connected to the base and rotatable relative thereto. An alignment shaft is threadably engaged with the threaded mounting shaft and connected to the base such that rotation of the threaded mounting shaft causes longitudinal movement of the alignment shaft relative to the threaded mounting shaft and the base. An adjustment device is connected to the threaded mounting shaft for rotating the threaded mounting shaft to move threads on the alignment shaft into engagement with the leads to move the leads into alignment with the pads.

21 Claims, 19 Drawing Sheets

(56) References Cited

U.S. PATENT DOCUMENTS

| | | |
|---|---|---|
| 8,713,791 B1 | 5/2014 | Walker et al. |
| 2016/0285189 A1* | 9/2016 | Higgy .................. H01R 12/721 |

* cited by examiner

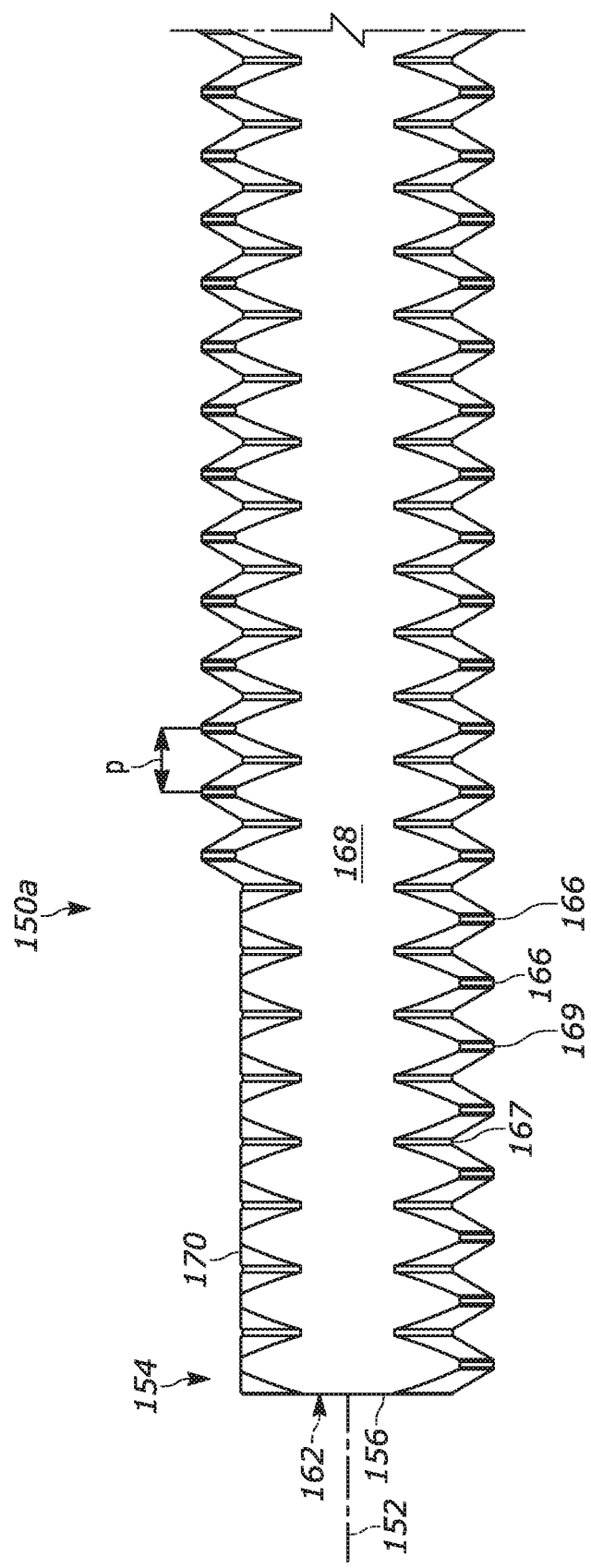

US 11,033,976 B1

SOLDERING FIXTURE

RELATED APPLICATIONS

This application claims the benefit of U.S. Provisional Application Ser. No. 62/657,559 filed 13 Apr. 2018, the entirety of which is incorporated by reference herein.

This invention was made with Government support under U.S. Navy, Space & Naval Warfare Systems Contract No. N00039-15-D-008. The Government has certain rights in this invention.

TECHNICAL FIELD

The present invention relates generally to electronics and, in particular, relates to a soldering fixture for securing an edge connector to a printed circuit board.

BACKGROUND

Connectors, such as ultra-high density type connectors, are used throughout the aircraft industry for power supplies, communication equipment, radar systems, etc. Such connectors are capable of transferring a large amount of signals in a small package. To this end, the surface-mount leads associated with the connectors are densely packed and therefore it is desirable to maintain finely tuned pitch-to-pitch accuracy during installation.

SUMMARY

In one example, a soldering fixture for coupling surface-mount leads of an edge connector to corresponding pads on a PCB includes a base for positioning over the edge connector. A threaded mounting shaft is connected to the base and rotatable relative thereto. An alignment shaft is threadably engaged with the threaded mounting shaft and connected to the base such that rotation of the threaded mounting shaft causes longitudinal movement of the alignment shaft relative to the threaded mounting shaft and the base. An adjustment device is connected to the threaded mounting shaft for rotating the threaded mounting shaft to move threads on the alignment shaft into engagement with the leads to move the leads into alignment with the pads.

In another example, a method of coupling surface-mount leads of an edge connector to corresponding pads on a PCB includes positioning a base of the soldering fixture over the edge connector. A threaded mounting shaft is connected to the base and is rotatable relative thereto. An alignment shaft is threadably engaged with the threaded mounting shaft and connected to the base such that rotation of the threaded mounting shaft causes longitudinal movement of the alignment shaft relative to the threaded mounting shaft and the base. An adjustment device connected to the threaded mounting shaft is rotated to rotate the threaded mounting shaft and move threads on the alignment shaft into engagement with the leads to move the leads into alignment with the pads.

Other objects and advantages and a fuller understanding of the invention will be had from the following detailed description and the accompanying drawings.

BRIEF DESCRIPTION OF THE DRAWINGS

FIG. 5B is an enlarged view of a portion of the alignment shaft of FIG. 5A.

DETAILED DESCRIPTION

Figure 1:
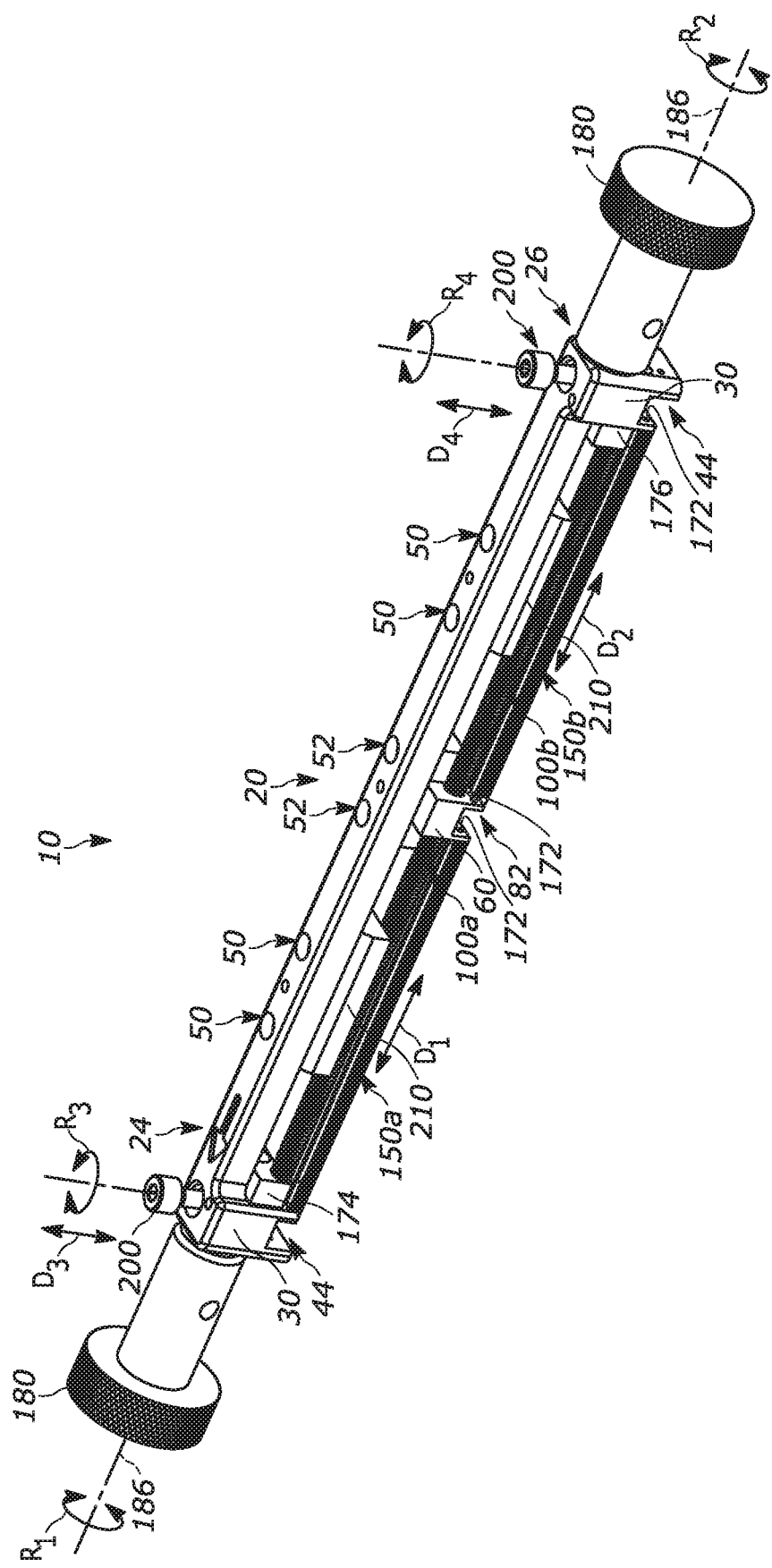
FIG. 1 is a schematic illustration of an example soldering fixture.
Figure 2:
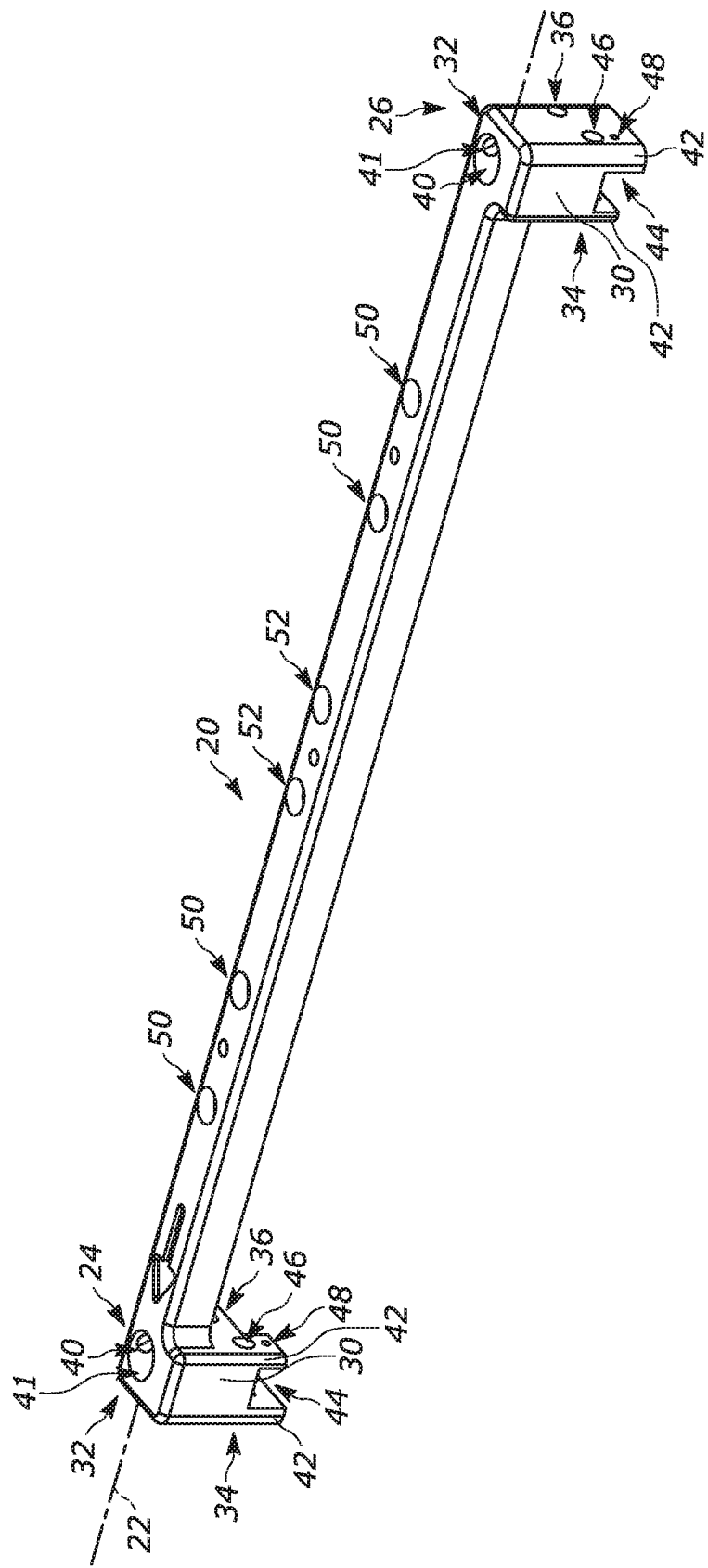
FIG. 2 is a perspective view of a base of the soldering fixture of FIG. 1.

The present invention relates generally to electronics and, in particular, relates to a soldering fixture for securing an edge connector to a printed circuit board. FIG. 1 illustrates an example soldering fixture 10. The fixture 10 includes a base 20 (FIG. 2) extending along a centerline 22 from a first end 24 to a second end 26. The base 20 can be formed from a durable material such as metal or a polymer. A mounting block 30 is integrally formed with (as shown) or secured to (not shown) each of the first and second ends 24, 26 of the base 20. Each mounting block 30 extends away from the centerline 22 such that the mounting blocks extend generally parallel to one another.

Each mounting block 30 includes an upper side 32, a lower side 34, and a lateral side 36. A first opening 40 extends from the upper side 32 entirely through each mounting block 30 and transverse to the centerline 22. The first opening 40 includes a counterbore 41 extending from the upper side 32.

Legs 42 extend downward (as shown) from the lower side 34 and define a notch 44 therebetween. The notch 44 has a rectangular cross-section but other shapes are contemplated. First and second lateral passages 46, 48 extend from the lateral side 36 entirely through the mounting block 30 and parallel to the centerline 22. The first and second lateral passages 46, 48 are aligned with one another in the vertical direction. The first lateral passages 46 are co-axial with one another. The second lateral passages 48 are co-axial with one another.

Associated pairs of second openings extends 50 through the base 20 between the first and second ends 24, 26. A pair of third openings 52 extends through the base 20 between the associated pairs of second openings 26.

Figure 3:
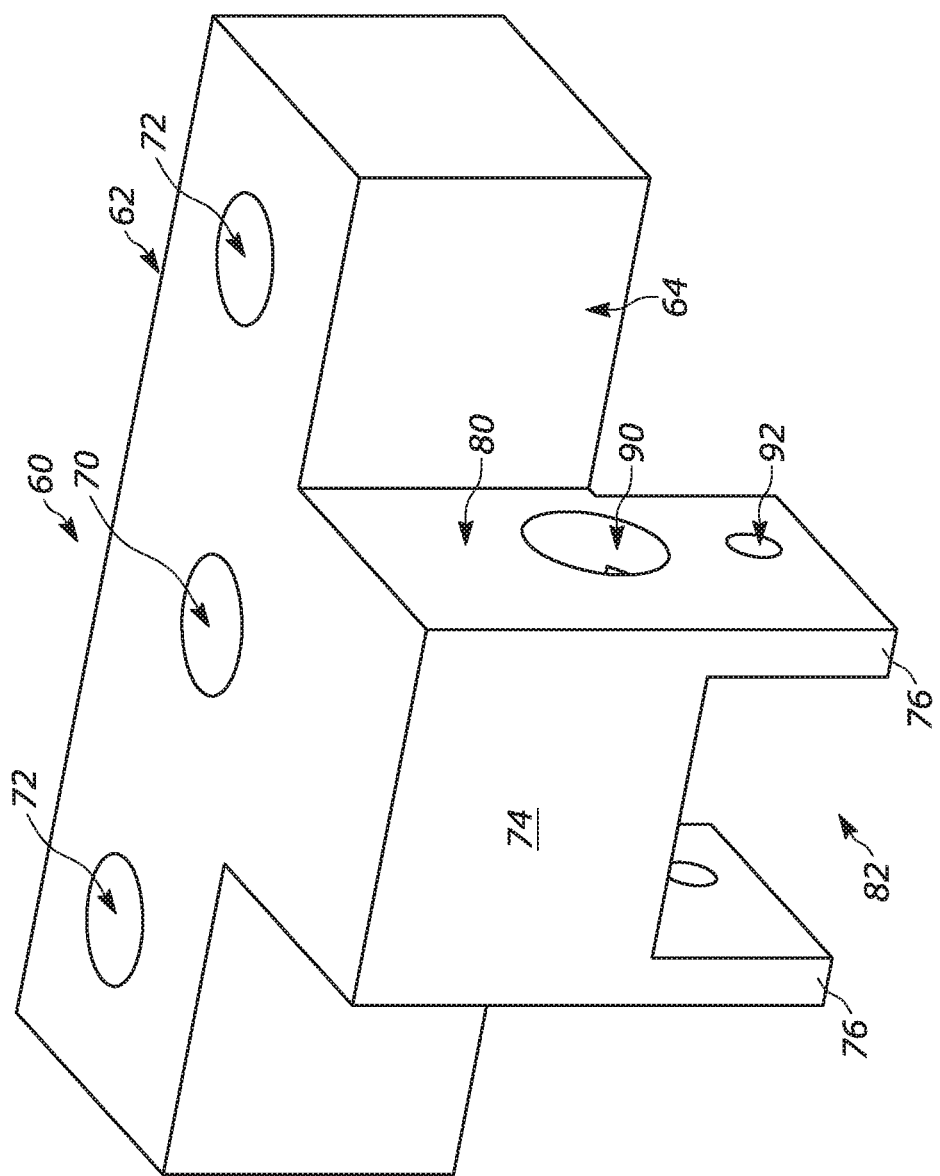
FIG. 3 is a perspective view of a mounting block of the soldering fixture of FIG. 1.

Another mounting block 60 (FIG. 3) is secured to the base 20 between the mounting blocks 30. As shown in FIG. 1, the mounting block 60 can be equidistant from the mounting blocks 30. The mounting block 60 includes an upper side 62 and a lateral side 64. The upper side 62 engages the base 20 and includes a first opening 70 and a pair of second openings 72 positioned on opposite sides of the first opening. Fasteners (not shown) extend through the third openings 52 in the base 30 and the second openings 72 in the mounting block 60 to secure the mounting block 60 to the base. Another fastener (not shown) can extend through an opening between the third openings 52 in the base 30 and the first opening 70 in the mounting block 60.

A projection 74 extends away from the lateral side 64 of the mounting block 60. Legs 76 extend downward (as shown) from the projection 74 and define a notch 82 therebetween. The notch 82 has a rectangular cross-section but other shapes are contemplated. The notch 82 can have the same size and shape as the notch 44 in the mounting block 30. First and second lateral passages 90, 92 extend from a lateral side 64 of the projection 74 entirely therethrough. The first and second lateral passages 90, 92 are aligned with one another in the vertical direction.

The mounting blocks 30, 60 are positioned on the base 20 such that the notches 44, 82 extend parallel to one another. Moreover, all the first lateral passages 46, 90 are co-axial with one another. All the second lateral passages 48, 92 are co-axial with one another.

Figure 4:
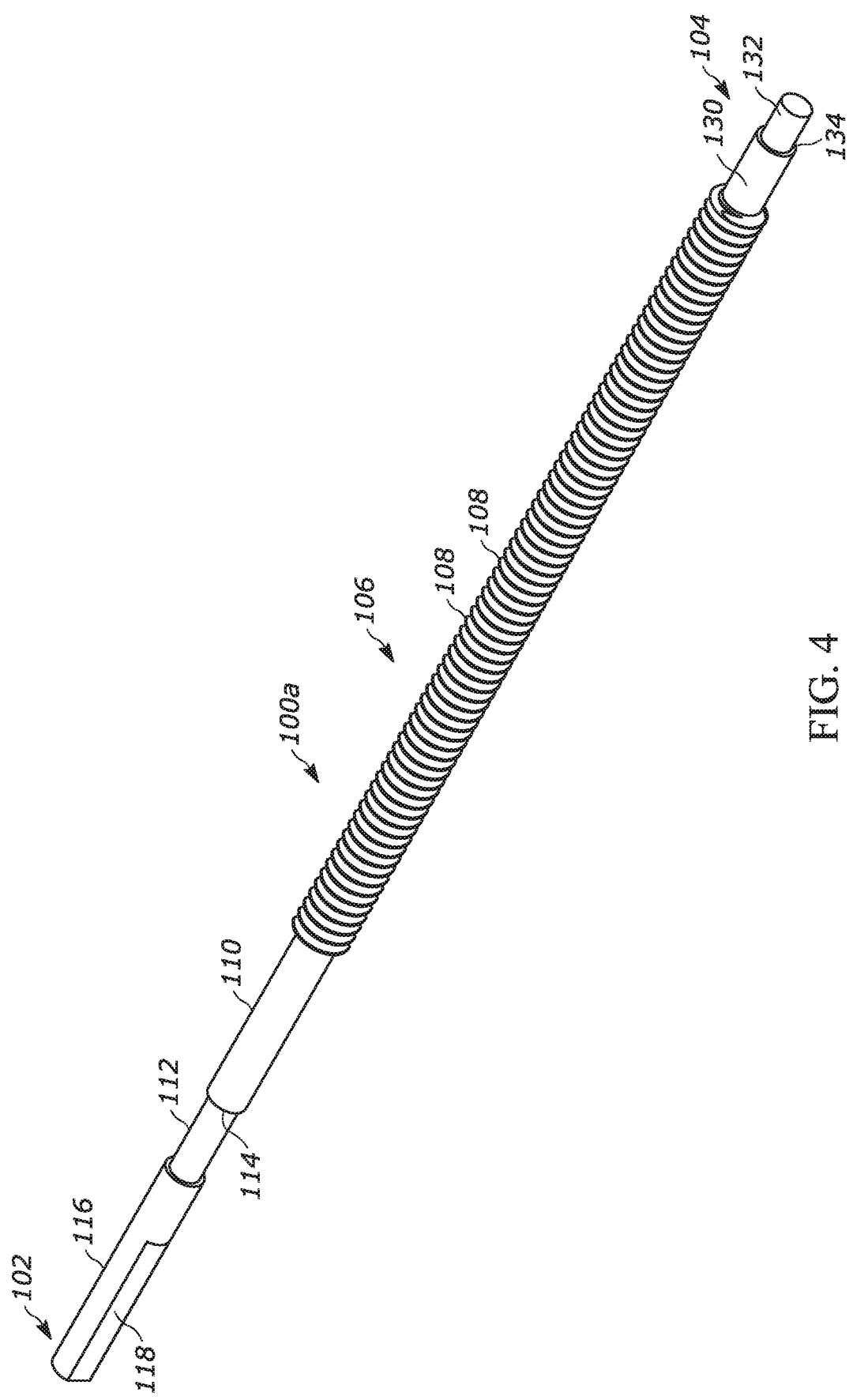
FIG. 4 is a perspective view of a mounting shaft of the soldering fixture of FIG. 1.

Referring to FIGS. 1 and 4, mounting shafts 100*a*, 100*b* are provided between pairs of the mounting blocks 30, 60. More specifically, a mounting shaft 100*a* extends between the mounting block 30 at the first end 24 of the base 20 and the mounting block 60. Another mounting shaft 100*b* is provided between the mounting block 30 at the second end 26 of the base 20 and the mounting block 60. Each mounting shaft 100*a*, 100*b* is identical and, thus, only the configuration of the mounting shaft 100*a* is discussed for brevity.

The mounting shaft 100*a* (FIG. 4) extends from a first end 102 to a second end 104. The mounting shaft 100*a* includes a threaded portion 106 and unthreaded portions 110, 130 provided at opposite ends of the threaded portion. The threaded portion 106 and unthreaded portions 110, 130 are co-axial. In one example, the threaded portion 106 includes helical threads 108. The unthreaded portion 110 extends from the threaded portion 106 towards the first end 102 and includes a portion 112 having a reduced diameter compared to the remainder of the unthreaded portion. An axial surface 114 demarcates the unthreaded portion 110 from the portion 112. A connecting member 116 extends from the portion 112 and has a planar face 118 such that the connecting member has a non-circular axial cross-section, e.g., a D-shaped axial cross-section.

The unthreaded portion 130 extends from the threaded portion 106 towards the second end 104 and includes a portion 132 having a reduced diameter compared to the remainder of the unthreaded portion. An axial surface 134 demarcates the unthreaded portion 130 from the portion 132.

The unthreaded portions 110, 130 of the mounting shafts 100*a*, 100*b* rotatably connect the mounting shafts to the mounting blocks 30, 60. In particular, the reduced diameter portion 112 of the mounting shaft 100*a* is rotatably received in the first lateral passage 46 in the mounting block 30 at the first end 24 of the base 20. The reduced diameter portion 132 of the mounting shaft 100*a* is rotatably received in the first lateral passage 90 in the mounting block 60.

Similarly, the reduced diameter portion 112 of the mounting shaft 100*b* is rotatably received in the first lateral passage 46 in the mounting block 30 at the second end 26 of the base 20. The reduced diameter portion 132 of the mounting shaft 100*b* is rotatably received in the first lateral passage 90 in the mounting block 60. Since the first lateral passages 46, 90 are co-axial the mounting shafts 100*a*, 100*b* are likewise co-axial.

Figure 5A:
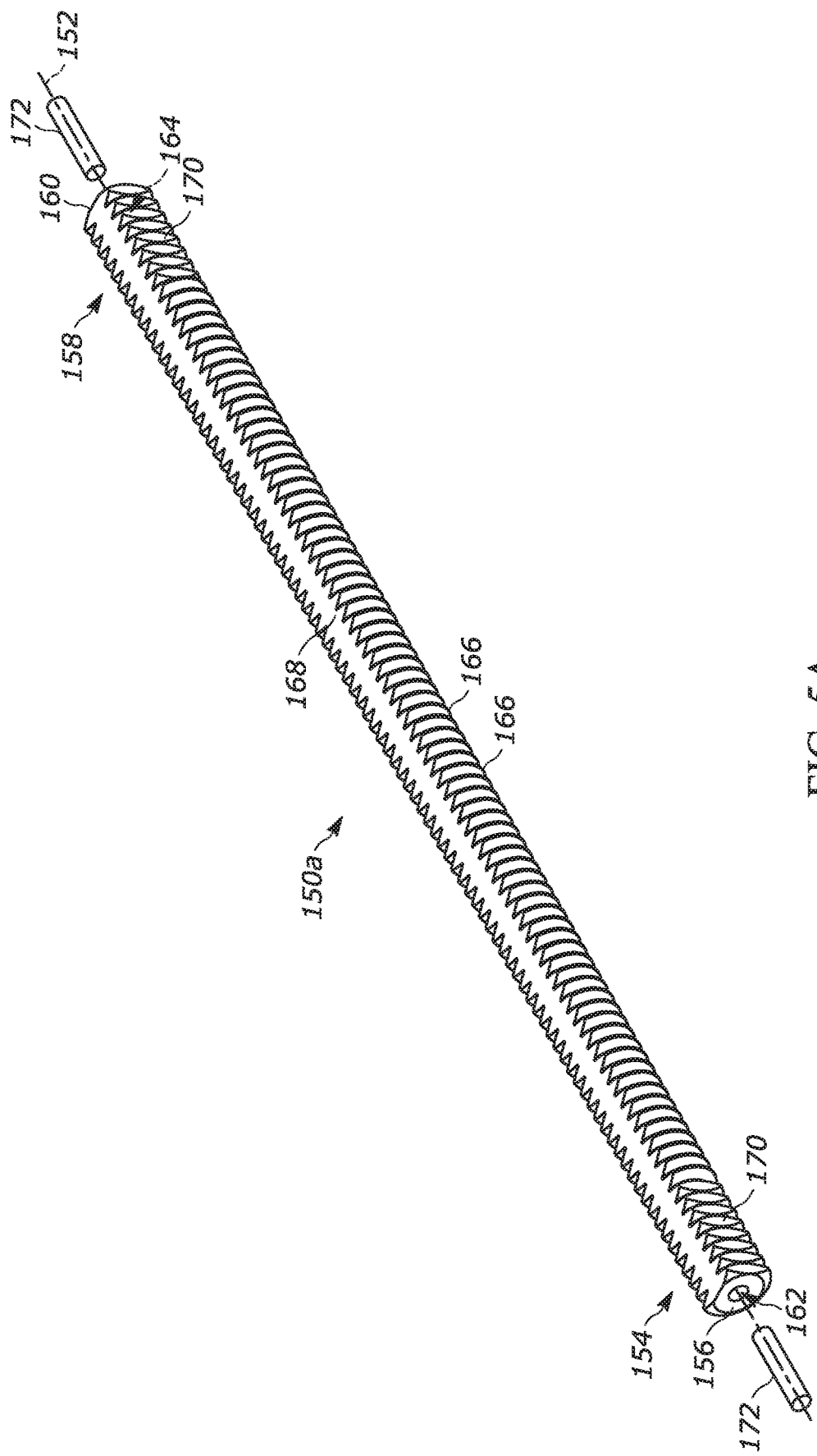
FIG. 5A is a perspective view of an alignment shaft of the soldering fixture of FIG. 1.

Alignment shafts 150*a*, 150*b* are associated with the mounting shafts 100*a*, 100*b*, respectively. Each alignment shaft 150*a*, 150*b* is identical and, thus, only the configuration of the mounting shaft 150*a* is discussed for brevity. Referring to FIGS. 5A-5B, the alignment shaft 150*a* extends along an axis 152 from a first end 154 to a second end 158. The first end 154 terminates at an axial end surface 156. The second end 158 terminates at an axial end surface 160. An opening 162 extends from the axial end surface 156 towards the second end 158 and along the axis 152. An opening 164 likewise extends from the axial end surface 160 towards the first end 154 and along the axis 152. Consequently, the openings 162, 164 are co-axial with one another.

Threads 166 extend substantially the entire length of the alignment shaft 150*a* and have a root 167, a crest 169, and a pitch p. In one example, the threads 166 are helical and have the same pitch as the helical threads 108 on the mounting shaft. More specifically, both threads 108, 166 can have an ANSI 4-40 thread configuration.

A first planar surface 168 extends the entire length of the alignment shaft 150*a*. Second planar surfaces 170 are provided at the ends 154, 158 of the alignment shaft 150*a* at 90° from the first planar surface 168 relative to the axis 152.

The alignment shaft 150*a* extends between the mounting block 30 at the first end 24 of the base 20 and the mounting block 60. The alignment shaft 150*b* extends between the mounting block 30 at the second end 26 of the base 20 and the mounting block 60. The alignment shafts 150*a*, 150*b* are slidably mounted in the mounting blocks 30, 60 but prevented from rotating relative thereto. To this end, dowel pins 172 (see FIGS. 1 and 5A) are inserted into the openings 162, 164 in the alignment shafts 150*a*, 150*b*. The dowel pin 172 in the opening 162 in the alignment shaft 150*a* is then inserted into the second lateral passage 48 in the mounting block 30 at the first end 24 of the base 20. The dowel pin 172 in the opening 164 in the alignment shaft 150*a* is inserted into the second lateral passage 92 in the mounting block 60.

Similarly, the dowel pin 172 in the opening 164 in the alignment shaft 150*b* is inserted into the second lateral passage 48 in the mounting block 30 at the second end 26 of the base 20. The dowel pin 172 in the opening 164 in the alignment shaft 150*b* is inserted into the second lateral passage 92 in the mounting block 60. Since the second lateral passages 48, 92 are co-axial the alignment shafts 150*a*, 150*b* are likewise co-axial.

Moreover, the alignment shafts 150*a*, 150*b* are oriented such that the second planar surfaces 170 face towards the base 30. Spacers 174, 176 (FIG. 1) are provided on the unthreaded portions 110 of the mounting shafts 100*a*, 100*b* and prevent rotation of the mounting shafts. More specifically, a spacer 174 is secured to the mounting block 30 at the first end 24 of the base 20 and rotatably receives the unthreaded portion 110 of the mounting shaft 100*a*. The spacer 174 has a rectangular shape and extends to or in close proximity with the second planar surface 170 of the alignment shaft 100*a*. As a result, the spacer 174—in combination with the planar surface 170—allows for rotation of the mounting shaft 100a relative to the alignment shaft 150a but prevents rotation of the alignment shaft 100a.

Similarly, a spacer 176 is secured to the mounting block 30 at the second end 26 of the base 20 and rotatably receives the unthreaded portion 110 of the mounting shaft 100b. The spacer 176 has a rectangular shape and extends to or in close proximity with the second planar surface 170 of the alignment shaft 100b. As a result, the spacer 176—in combination with the planar surface 170—allows for rotation of the mounting shaft 100b relative to the alignment shaft 150b but prevents rotation of the alignment shaft 100b.

The dowel pins 172 and alignment shafts 150a, 150b have lengths configured to allow the alignment shafts to move longitudinally relative to the mounting shafts 100a, 100b in the manners indicated by $D_1$ and $D_2$, respectively. More specifically, the dowel pins 172 allow the alignment shafts 150a, 150b to move in directions $D_1$, $D_2$ along their axes 152 and parallel to the centerline 22 of the base 20 relative to the mounting shafts 100a, 100b and the base 20. The legs 42, 76 and/or spacers 174, 176 can act as hard stops for longitudinal movement of the alignment shafts 150a, 150b in the manners $D_1$ and $D_2$, respectively, and therefore be configured to allow for a prescribed degree of longitudinal movement.

Since all the first lateral passages 46, 90 are vertically aligned with their respective second lateral passages 48, 92 connecting the mounting shafts 100a, 100b and alignment shafts 150a, 150b to the mounting blocks 30, 60 in the manner described aligns the mounting shaft 100a with the alignment shaft 150a such that the threads 108 are engaged with the threads 166. Similarly, the mounting shaft 100b is aligned with the alignment shaft 150b such that the threads 108 are engaged with the threads 166

Figure 6:
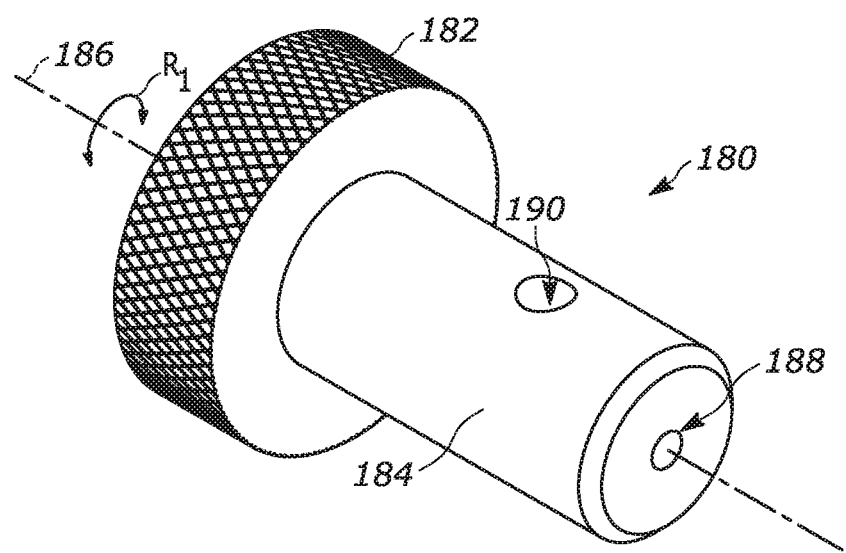
FIG. 6 is a perspective view of an adjustment device of the soldering fixture of FIG. 1.

Two adjustment devices 180 (FIG. 1) are provided for selectively rotating the mounting shafts 100a, 100b. Referring to FIG. 6, each adjustment device 180 includes a head or knob 182 and a shaft 184 extending from the head along an axis 186. A passage 188 extends along the axis 186 into the shaft 184 and receives the connecting member 116 of the mounting shaft 100a. A passage 190 extends radially towards the axis 186 and into the passage 188.

The passage 190 receives a dowel (not shown) that abuts the planar face 118 of the connecting member 116 to prevent relative rotation between the adjustment device 180 and the connecting member. As a result, rotation of the adjustment device 180 connected to the mounting shaft 100a about the axis 186 causes rotation of the mounting shaft 100a about the axis 186 in the manner $R_1$. The mounting shaft 100b is connected to the other adjustment device 180 in the same manner and, thus, rotation of the adjustment device 180 connected to the mounting shaft 100b about the axis 186 causes rotation of the mounting shaft 100b about the axis 186 in the manner $R_2$ indicated in FIG. 1. The mounting shafts 100a, 100b are not secured to one another and are therefore independently rotatable relative to one another.

Figure 7:
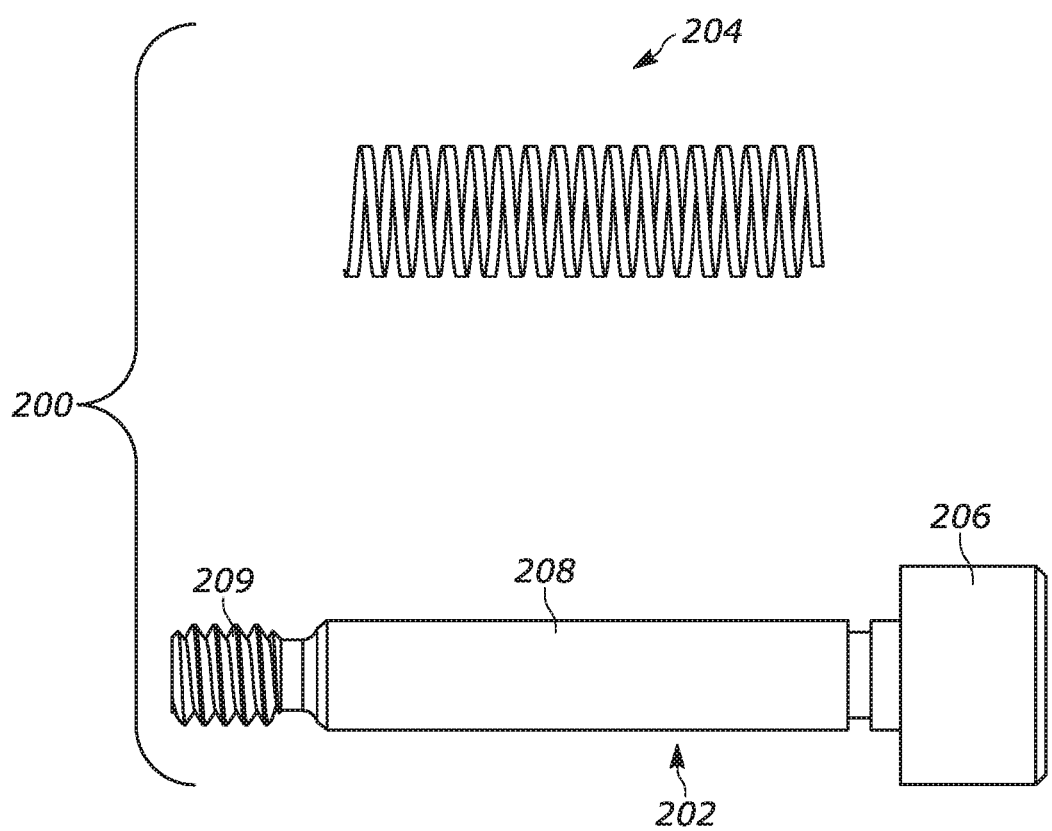
FIG. 7 is a perspective view of a retention device of the soldering fixture of FIG. 1.

The device 10 further includes retention devices 200 for connection to each mounting block 30. Each device 200 (FIG. 7) includes a pin 202 and a spring 204. The pin 202 has a head 206 and a shaft 208 extending from the head. The shaft 208 extends into the opening 40 in each base 30 (FIG. 1) and includes a threaded portion 209. The spring 204 encircles the shaft 208 and is positioned between the head 206 and the counterbore 41 in the first opening 40 in the mounting block 30. Rotating the pin 202 at the first end 24 of the base 30 in the manner $R_3$ moves the device 200 axially in the manner $D_3$ relative to the base. Rotating the pin 202 at the second end 26 of the base 30 in the manner $R_4$ moves the device 200 axially in the manner $D_4$ relative to the base.

Referring to FIG. 1, a pair of tapered support members 210 are secured to the base 20 for supporting the mounting shafts 100a, 100b. The support members 210 are positioned between the base 20 and the mounting shafts 100a, 100b with tapered ends located adjacent the threads 108 on the mounting shafts 100a, 100b. Fasteners (not shown) extend through the openings 50 and into the support members 210 to secure the support members to the base 20.

The soldering fixture 10 is used to couple leads or terminals of a connector to corresponding pads on a printed circuit board (PCB). In one example shown in FIG. 8A, the connector 220 is an edge connector such as a ribbon connector, NAFI connector, ultra-high density modular connector, etc. The leads 230 are surface-mount leads such as gullwing leads, L-shaped ribbon leads, J-leads, etc.

Figure 8A:
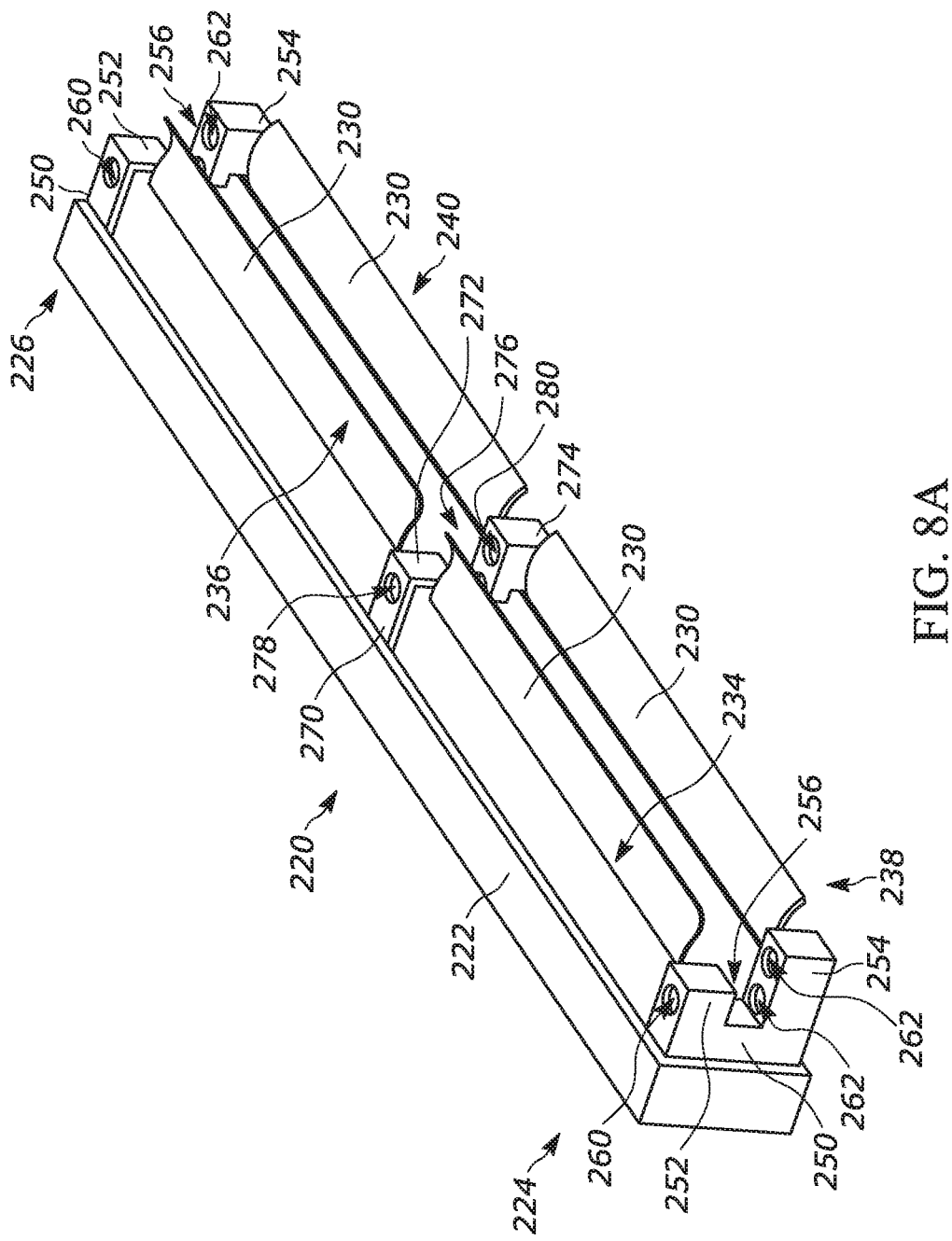
FIG. 8A is a schematic illustration of an example edge connector for use with the soldering fixture of FIG. 1.
Figure 8B:
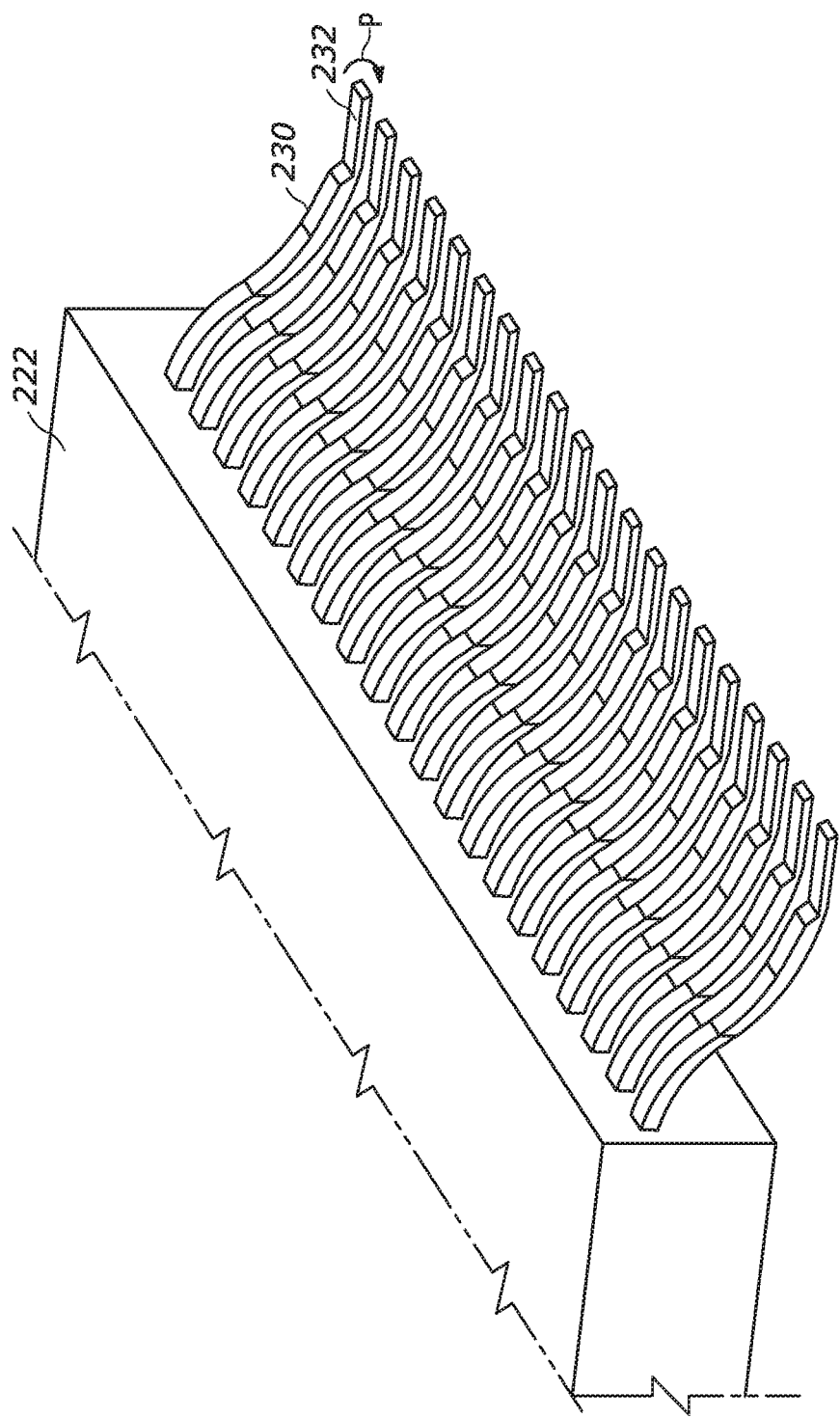
FIG. 8B is an enlarged view of a portion of FIG. 8A.

As shown in FIGS. 8A-8B, the connector 220 includes a base 222 extending between first and second ends 224, 226. Resilient leads 230 extend from the base 222 and parallel to one another. As shown, the leads 230 are arranged in coextensive rows, namely, coextensive first and second rows 234, 236 and coextensive third and fourth rows 238, 240.

The leads 230 are secured to the base 222 with a free end 232 being pivotable relative to the base in the manner P. The connector 220 can be an ultra-high density (UHD) connector and can therefore include tens, hundreds or thousands of leads 230. The leads 230 can have a width and spacing approximating the pitch p of the threads 166 on the alignment shafts 150a, 150b.

Receiving elements 250 are secured to the first and second ends 224, 226 of the base. Another receiving element 270 is secured to the base 222 between the first and second ends 224, 226. A pair of the receiving elements 250, 270 is positioned on opposite sides of the first and third rows 234, 238 of leads 230. Another pair of the receiving elements 250, 270 is positioned on opposite sides of the second and fourth rows 250, 270 of leads 230.

Each receiving element 250 includes first and second legs 252, 254 extending away from the base 222 and separated by a notch 256. The leg 252 includes a threaded opening 260. The leg 254 includes a pair of threaded openings 262. Each receiving element 270 includes first and second legs 272, 274 extending away from the base 222 and separated by a notch 276. The leg 272 includes a threaded opening 278. The leg 274 includes a pair of threaded openings 280.

The leads 230 in the first and second rows 234, 236 are generally aligned with the first legs 252, 272 of the receiving elements 250, 270. The leads 230 in the second and fourth rows 238, 240 are generally aligned with the second legs 254, 274 of the receiving elements 250, 270. The notches 256, 276 in the receiving elements 250, 270 are aligned with one another and provided in a plane lying generally between the leads 230 in the first and second rows 234, 236 and the leads 230 in the third and fourth rows 238, 240.

Figure 9A:
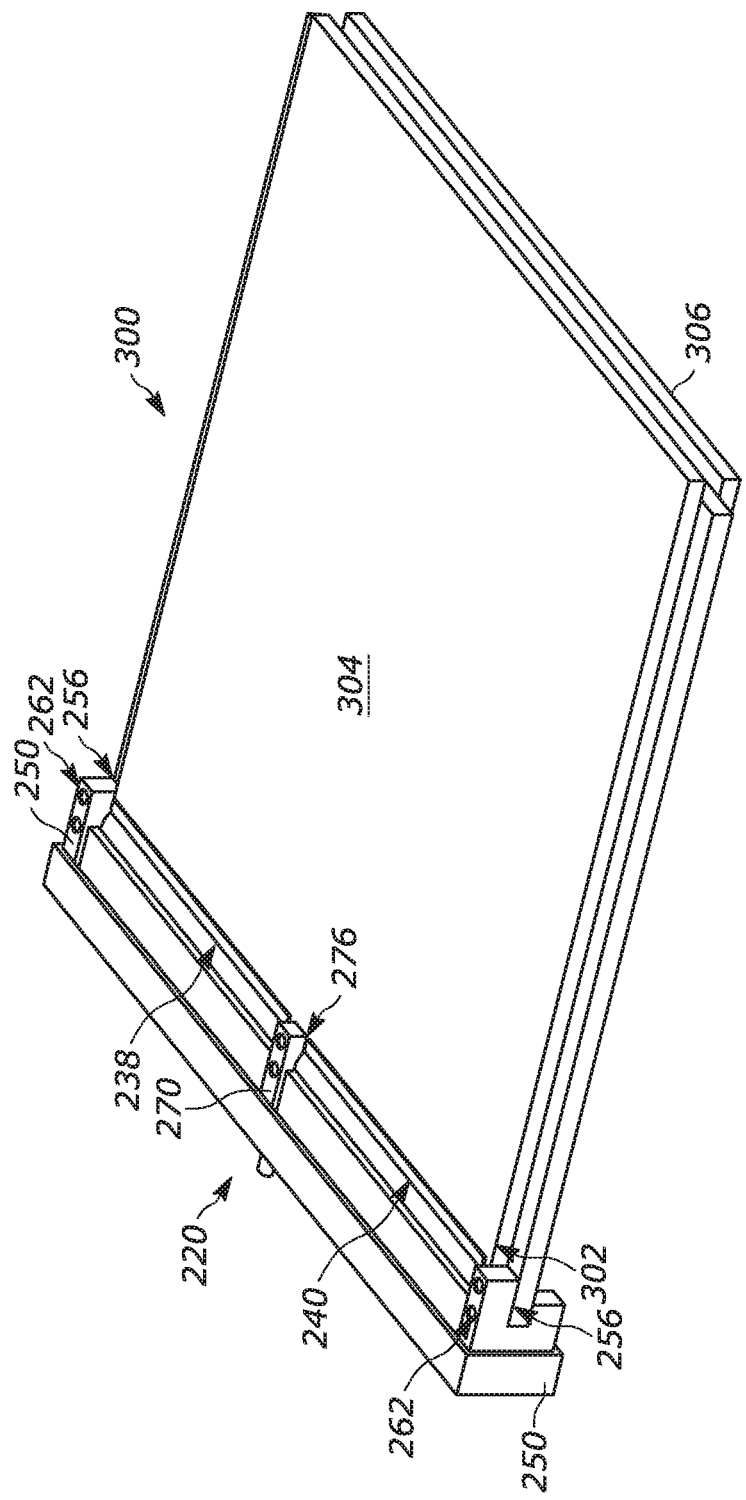
FIG. 9A is a schematic illustration of a printed circuit board (PCB) connected to the edge connector of FIG. 8A.
Figure 9B:
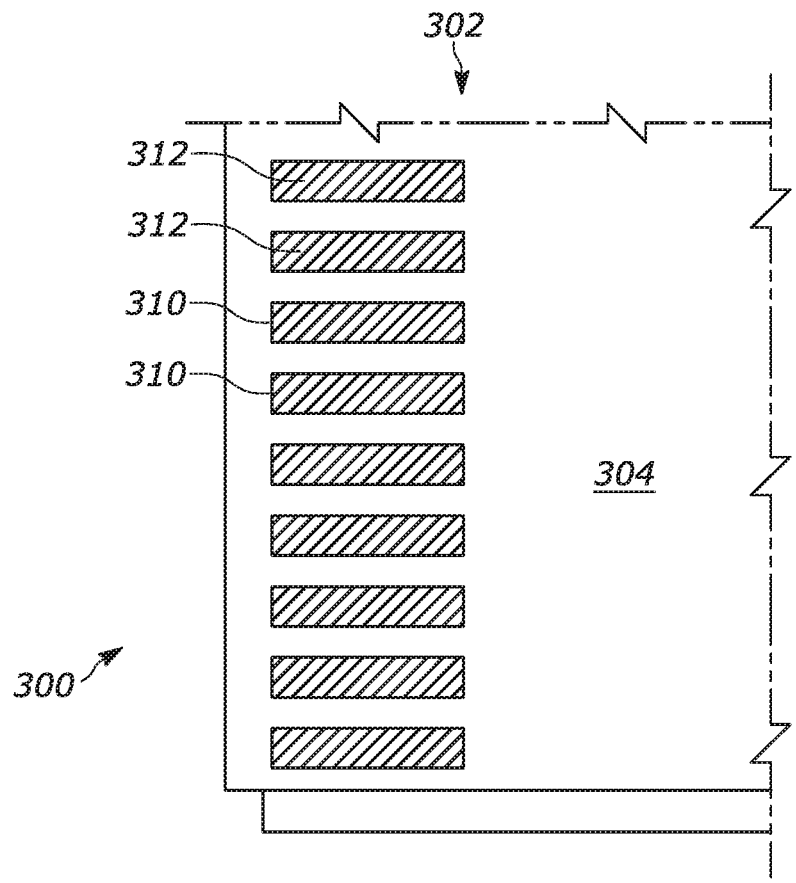
FIG. 9B is an enlarged view of a portion of the PCB of FIG. 9A.
Figure 9C:
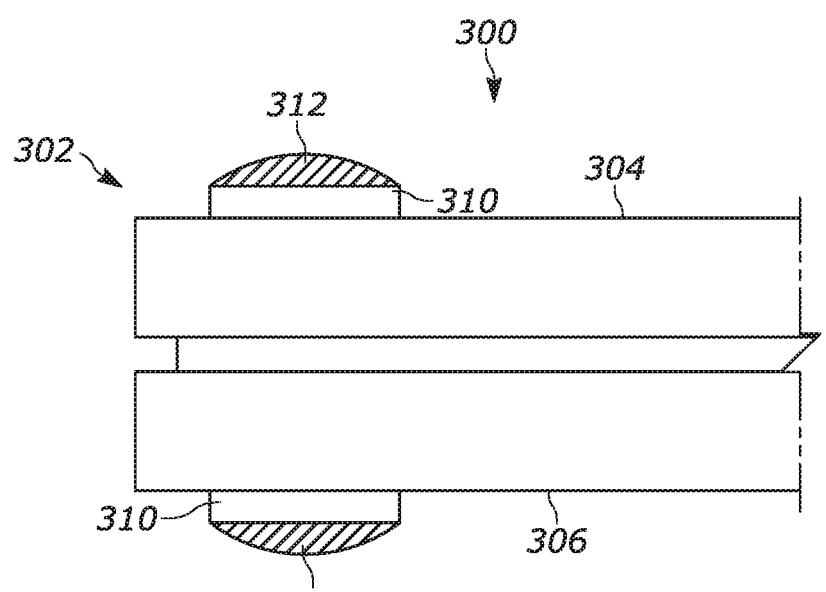
FIG. 9C is a side view of the PCB portion of FIG. 9B.

The notches 256, 276 cooperate to receive the PCB 300. Referring to FIG. 9A, the PCB 300 and connector 220 are turned upside-down to facilitate inserting the PCB into the connector. The PCB 300 has a generally planar shape, e.g., rectangular, square, round or any polygonal shape. As shown, the PCB 300 is rectangular and includes an end 302 and opposing surfaces 304, 306. Lands 310 are provided on each surface 304, 306 at the end 302 of the PCB 300 and are electrically connected to circuitry (not shown) on the PCB. In one example, solder, e.g., 100% pre-tin (not shown), can be applied to each land 310. In any case, the lands 310 have the same spacing from one another as the spacing between the leads 230.

The end 302 of the PCB 300 is positioned within the notches 256, 276 until the end bottoms out in the notches. This positions the third and fourth rows 238, 240 of leads 230 on one side of the PCB 300 adjacent the surface 304 and the first and second rows 234, 236 of leads on the other side of the PCB adjacent the surface 306. Fasteners (not shown) thread into the openings 256, 276 and into engagement with the PCB 300 to secure the PCB to the connector 220. The connector 220 and PCB 300—now connected together—are then flipped over to the orientation shown in FIG. 10A in which the surface 306 faces upwards.

The alignment shafts 100a, 100b on the soldering fixture 10 can be centered prior to connecting the fixture to the connector 220. To this end, the adjustment device 180 at the first end 24 can be rotated in the manner $R_1$ to move the alignment shaft 150a in the manner $D_1$ until the alignment shaft 150a is centered between the legs 252, 272. The adjustment device 180 at the second end 24 can be rotated in the manner $R_2$ to move the alignment shaft 150b in the manner $D_2$ until the alignment shaft 150b is centered between the legs 225, 272. For the reasons discussed, the alignment shafts 150a, 150b do not and cannot rotate during longitudinal movement in the manners $D_1$, $D_2$.

The fixture 10 is then positioned over the connector 220 and connected thereto. More specifically, the mounting block 30 at the first end 24 of the base 20 is positioned over the first leg 252 of the receiving element 250 at the first end 224 of the connector 220 to locate the first leg between the legs 42 and within the notch 44 therebetween. The mounting block 30 at the second end 26 of the base 20 is positioned over the first leg 252 of the receiving element 250 at the second end 226 of the connector 220 to locate the first leg between the legs 42 and within the notch 44 therebetween. This positions the mounting block 60 over the first leg 272 of the receiving element 270 so that the first leg is located between the legs 76 and within the notch 82 therebetween. Connecting the mounting blocks 30, 60 to the receiving elements 250, 270 in this manner positions the mounting shafts 100a, 100b and alignment shafts 150a, 150b adjacent the leads 230 in the first and second rows 234, 236 (FIG. 10B).

That said, the adjustment devices 180 are adjusted to precisely align the threads 166 with the leads 230. The adjustment device 180 at the first end 24 is rotated in the manner $R_1$ to move the alignment shaft 150a (via the mounting shaft 100a) in the manner $D_1$ until the roots 167 of the threads 166 are aligned with the leads 230 in the first row 234. The adjustment device 180 at the second end 26 is rotated in the manner $R_2$ to move the alignment shaft 150b (via the mounting shaft 100b) in the manner $D_2$ until the roots 167 of the threads 166 are aligned with the leads 230 in the second row 236. In other words, each thread 166 is positioned between adjacent pairs of leads 230 in each row 234, 236.

The adjustment device 180 and threads 108 on the mounting shafts 100a, 100b is configured such that the longitudinal position of the alignment shafts 150a, 150b can be precisely controlled. To this end, the adjustment device 180 and threads 108 can be configured such that ¼ rotation of the adjustment device results in about 0.006" of longitudinal movement of the corresponding alignment shaft 150a, 150b in the manner $D_1$ or $D_2$. Other rotation/longitudinal movement correlations are contemplated. It will be appreciated that the adjustment devices 180 can be rotated manually or automated, e.g., connected to a servo motor.

Figure 10A:
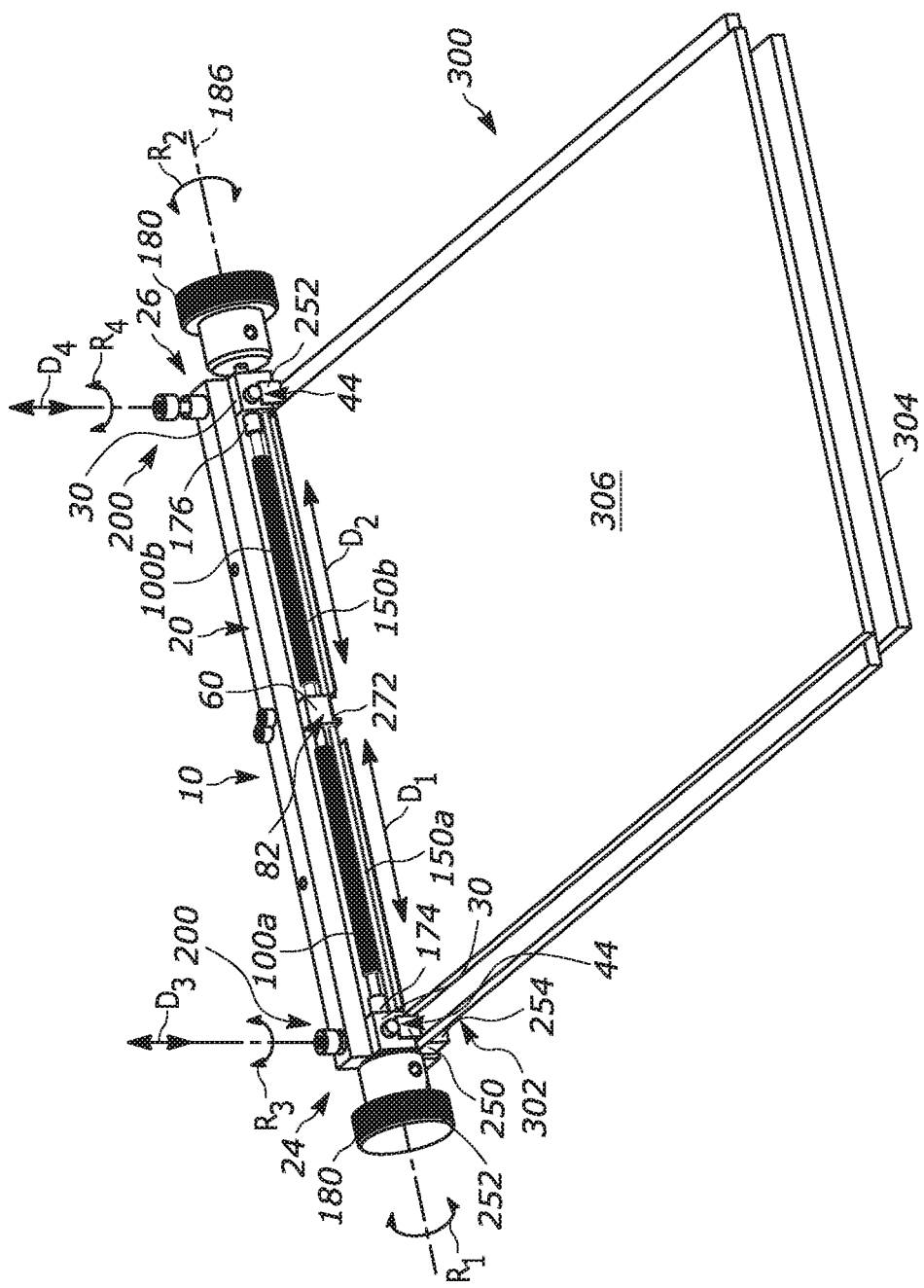
FIG. 10A is a schematic illustration of the soldering fixture of FIG. 1 connected to the edge connector and PCB of FIG. 9A.
Figure 10B:
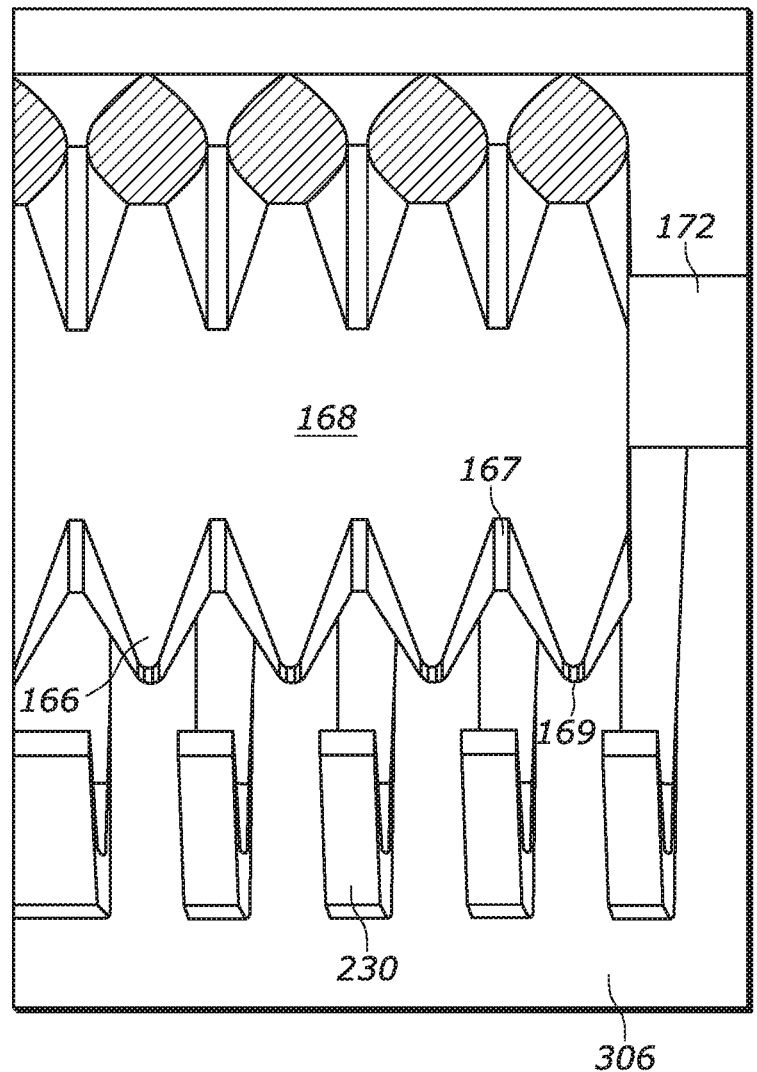
FIG. 10B is an enlarged view of a portion of the soldering fixture of FIG. 10A.

As shown in FIG. 10A, the pin 202 at the first end 24 of the base 30 is advanced in the manner $D_3$ and rotated in the manner $R_3$ to engage the threads 209 with the threaded opening 260 in the receiving element 250 at the first end. The pin 202 at the second end 26 is advanced in the manner $D_4$ and rotated in the manner $R_4$ to engage the threads 209 with the threaded opening 260 in the receiving element 250 at the second end. Rotating the pins 202 in this manner compresses the springs 204 and securely fastens the soldering device 10 to the connector 220. More specifically, the retention devices 200 cooperate to apply a co-planar force between the base 20 and the alignment shafts 150a, 150b. This co-planar force is then transferred from the alignment shafts 150a, 150b to the leads 230, which is then applied between the leads 230 and the lands 318.

Figure 11A:
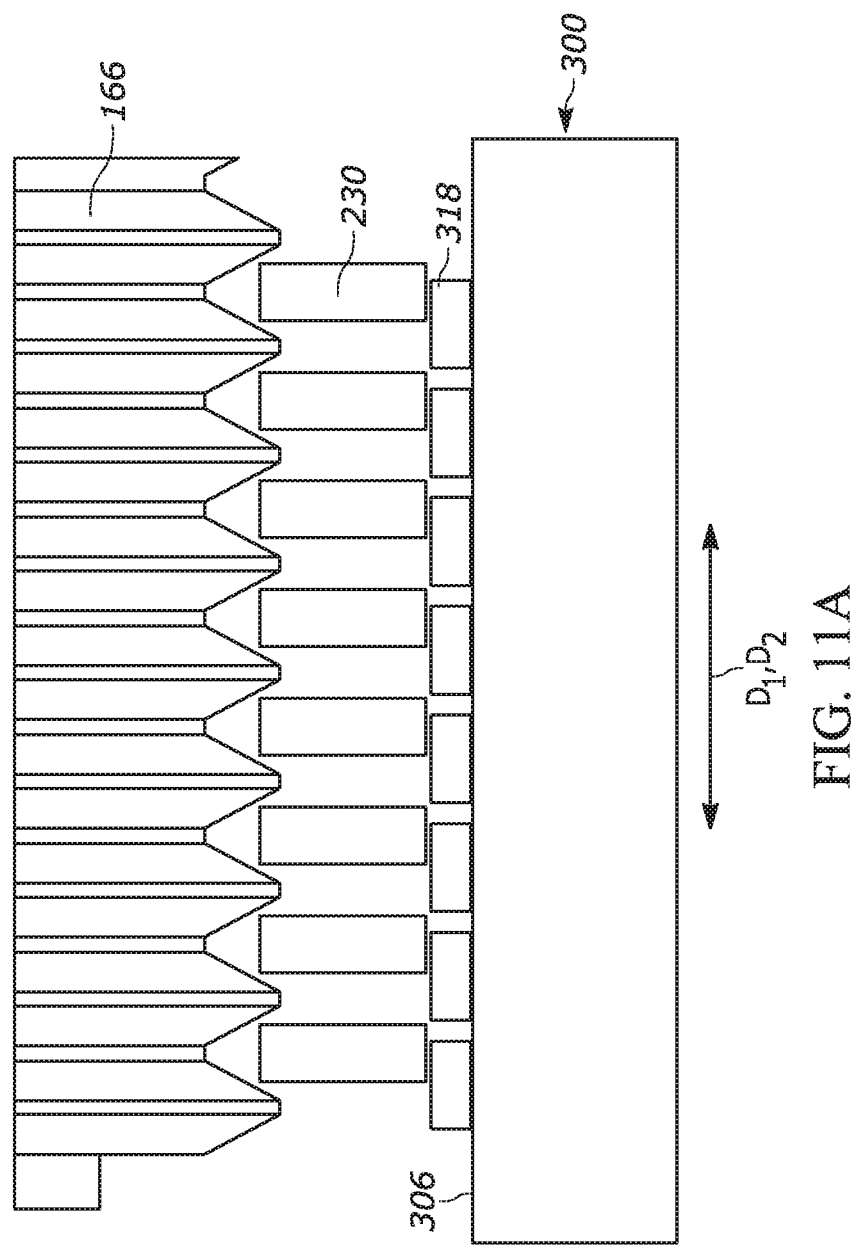
FIG. 11A illustrates leads of the connector out of alignment with pads on the PCB.
Figure 11B:
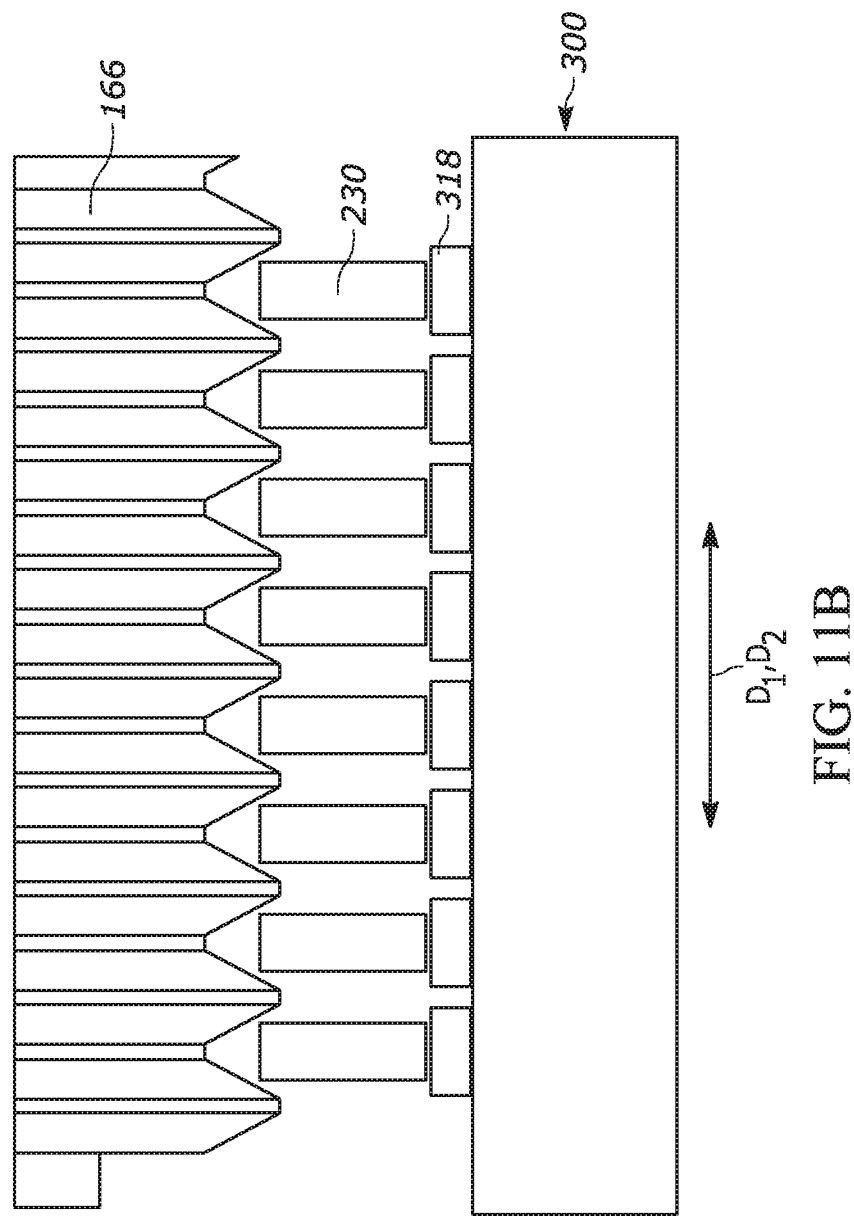
FIG. 11B illustrates the leads aligned with the pads on the PCB.

Once the devices 200 are tightened, the user checks the alignment between the leads 230 in the first and second rows 234, 236 and the lands 318 on the surface 306. The leads 230 will either be offset/misaligned from the corresponding land (FIG. 11A) or centered over each corresponding land 318 (FIG. 11B) or. If the former occurs, the adjustment devices 180 are rotated in the manners $R_1$, $R_2$ to move the threads in the manners $D_1$, $D_2$ to simultaneously deflect all the leads 230 until alignment between the leads and the lands 318 occurs. In particular, the threads 166 move in the longitudinal manners $D_1$, $D_2$, which is perpendicular to the length or long axis of each leads 230, thereby applying a bending moment thereto that deflects the leads into alignment with the lands 218.

During this alignment step, the alignment shafts 150a, 150b are manipulated to provide load/stress relief to the leads 230. To this end, the adjustment devices 180 are rotated in the manners $R_1$, $R_2$ to purposefully move the leads 230 first into alignment with the lands 318 but then slightly past alignment in the same direction. In other words, the misalignment is overcorrected—the alignment shafts 150a, 150b are moved too far right if a rightward correction of the leads 230 is needed and too far left if a leftward correction of the leads is needed. The adjustment devices 180 are then rotated in the opposite direction to return the leads 230 to positions aligned with the respective lands 318. This backtracking of the alignment shafts 150a, 150b helps to relieve/reduce stress on the leads 230 by allowing the leads to relax to center with their own pressure relieving the stress.

The aligned leads 230 are then coupled to the lands 318 by soldering. In one example, flux is applied across the leads 230 adjacent the lands 318. A hot air or soldering gun is then passed over the leads 230 in close proximity with the interfaces between the leads and the pre-tin 320 on the lands 318. This reflows the pre-tin and electrically connects the leads 230 to the lands 318, thereby coupling the connector 220 to the PCB 300 once the reflowed pre-tin solidifies.

Once the first and second rows 234, 236 of leads 230 are coupled to the respective lands 318, the retention devices 200 are disengaged from the receiving elements 250, 270 and the fixture 10 removed therefrom. The interconnected connector 220 and PCB 300 are both flipped over so that the surface 304 faces upwards. The fixture 10 is positioned over the receiving elements 250, 270 such that the second legs 254, 274 extend into the notches 44, 82 in the mounting blocks 30, 60. This positions the alignment shafts 150a, 150b over the leads 230 in the third and fourth rows 238, 240, which are adjacent the lands 310 on the surface 304 of the PCB 300.

The process described above is repeated for the leads 230 in the third and fourth rows 238, 240. The fixture 10 is then removed from the connector 220, which is now secured to the PCB 300 and electrically coupled thereto.

Figure 12A:
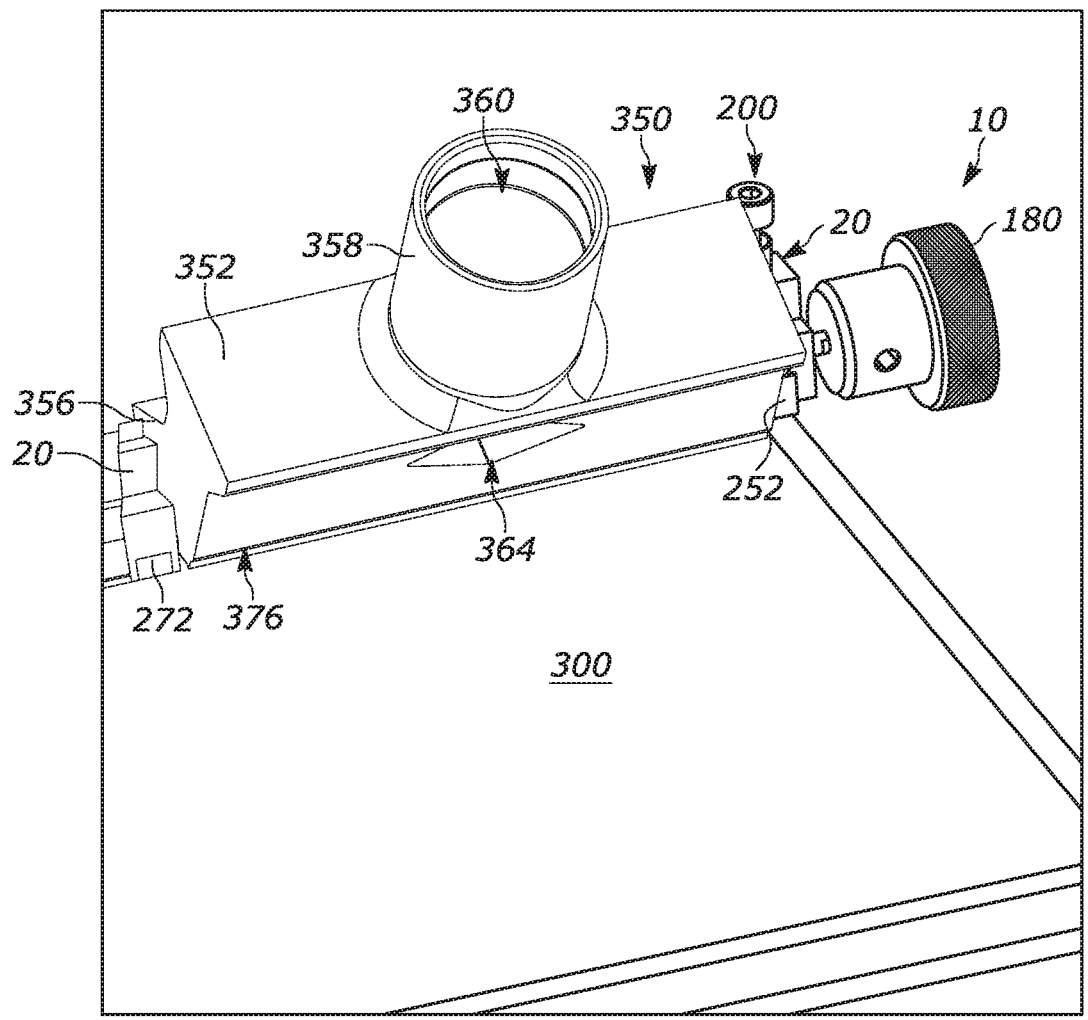
FIG. 12A is a schematic illustration of an example airflow plenum adaptor connected to the soldering fixture.
Figure 12B:
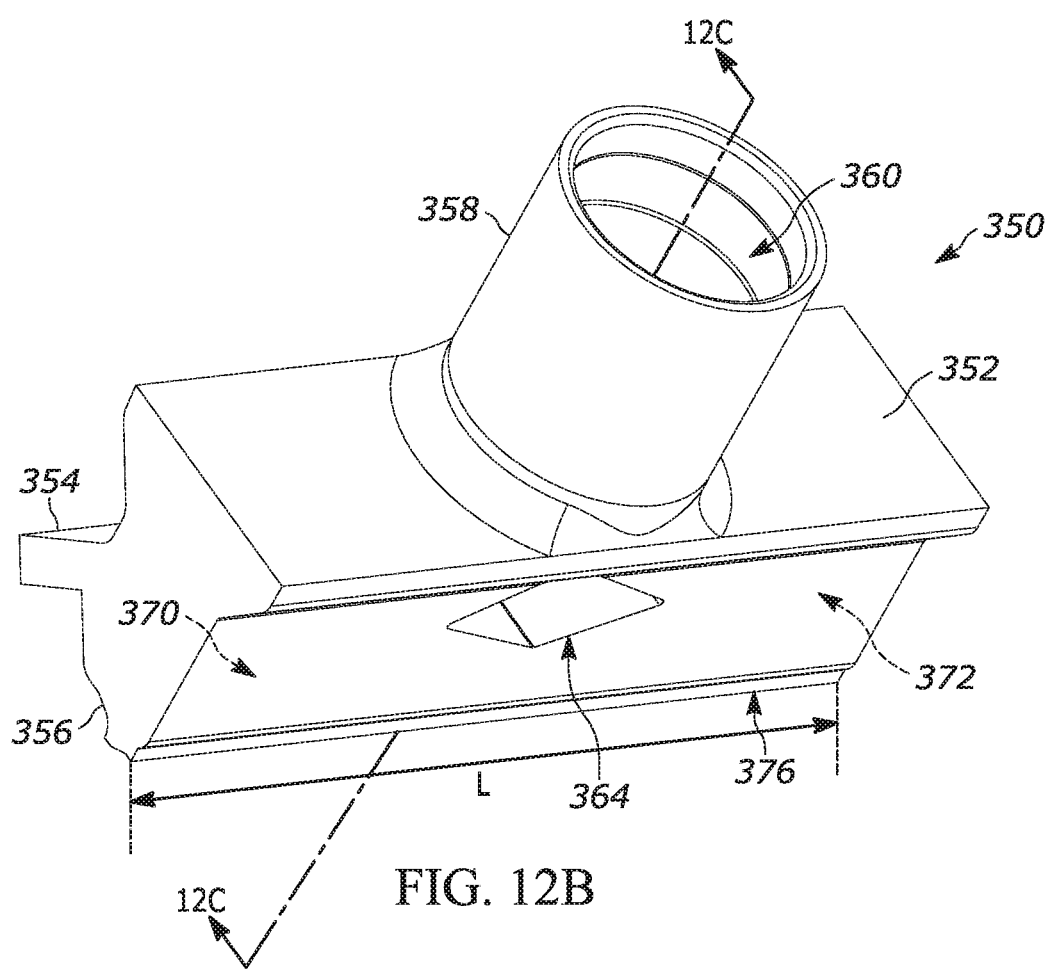
FIG. 12B is a side view of the adaptor of FIG. 12A.
Figure 12C:
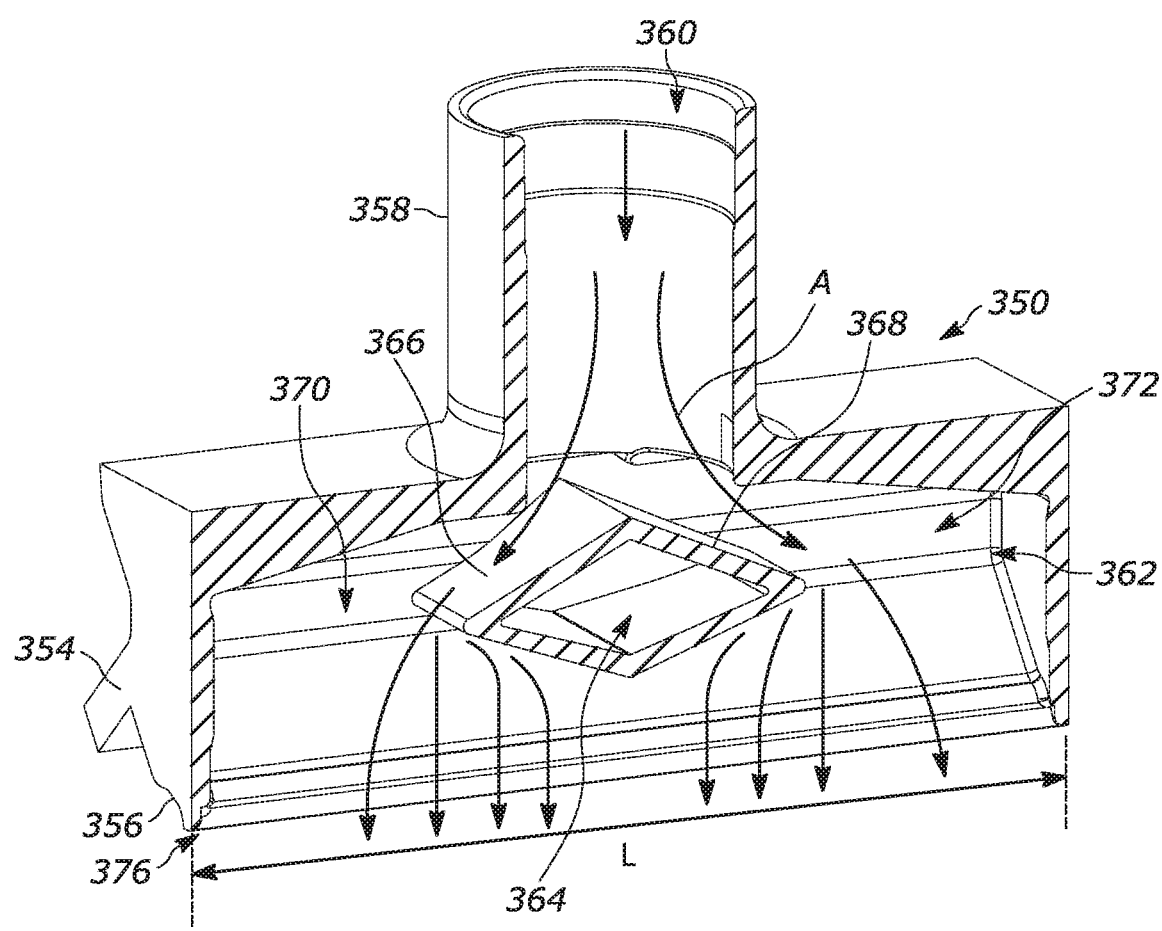
FIG. 12C is a section view taken along line 12C-12C of FIG. 12B.

In one example shown in FIGS. 12A-12C, an airflow plenum adaptor 350 can be connected to the fixture 10 for helping to direct and focus hot air from the soldering gun across the solder/pre-tin 320 between the leads 230 and the lands 318. The adaptor 350 (FIGS. 12B-12C) includes a base 352 having a length L substantially equal to the length of each row 234, 236, 238, 240 of leads 230. A leg 354 extends away from the base 352 in a first direction. A tube 358 extends away from the base 352 in a second direction generally opposite the first direction. The base 352 includes a curved, e.g., concave, surface or portion 356 located on the same side of the base as the leg 354.

The tube 358 defines a first passage 360 extending to and fluidly connected with a chamber 362 defined by the base 352. A lateral passage 364 extends through the base 352 to define walls 366, 368 that divide the chamber 362 into different portions 370, 372 located on opposite sides of the passage 364. As shown, the passage 364 is diamond shaped and, thus, the walls 366, 368 are collectively diamond shaped.

The portions 370, 372 of the chamber 362 extend to a common slot or second passage 376 extending along the length L of the base 352 at the bottom thereof. In one example, the second passage 376 is elongated, e.g., rectangular, and extends substantially the entire length L of the base 352. The second passage 376 is fluidly connected to the chamber 362 and therefore fluidly connected to the first passage 360.

As shown, the adaptor 350 is positioned on the fixture 10 with the leg 354 engaging the base 20 (the top of the base in FIG. 12A) and the curved portion 356 receiving the alignment shaft 150b adjacent the second row 236 of leads 230. This aligns the second passage 376 with the pre-tin 320 provided between the lands 318 and leads 230. The base 352 is configured to span the entire second row 236 and, thus, the second passage 376 spans all the leads 230 in the second row. The leg 354 can include an alignment pin (not shown) that is received in a corresponding opening (not shown) in the base 20 to automatically orient the adaptor 350 on the fixture 10.

That said, the soldering gun (not shown) is inserted into the first passage 360. When the soldering gun is activated, heat generated therefrom will pass through the first passage 360 and into the chamber 362 in the manner indicated generally by the arrows A in FIG. 12C. The walls 366, 368 divert the incoming heat into the respective portions 370, 372 of the chamber 362. The heat then flows through the second passage 376 and into the area surrounding the second row 236.

Since the second passage 376 extends across all the leads 230 in the second row 236, the adaptor 350—though the walls 366, 368 and the second passage—uniformly distributes heat from the soldering gun to the second row of leads 230. More specifically, the adaptor 350 receives incoming heat over a first, wider cross-section (at the first passage 360) and outputs the heat over a narrower, more precise cross-section (at the second passage 376). This, in turn, helps to uniformly reflow the pre-tin 320 provided between the leads 230 and the lands 218 across the entire second row 236. The adaptor 350 can be removed from the base 20, reconnected adjacent another row 234, 238, 240, and the process repeated to help uniformly solder all the leads 230 on the connector 220 to the PCB 300.

The fixture shown and described herein in advantageous because it can be used to simultaneously align multiple leads in multiple rows with the corresponding lands on the PCB in a precise, repeatable, timely manner. Moreover, the first planar surfaces on the alignment shafts facilitate access to the soldering locations and inspection.

While the fixture shown and described herein includes two mounting shafts and corresponding alignment shafts it will be appreciated that the fixture can alternatively include a single mounting shaft and alignment shaft and therefore the middle mounting block can be omitted. The fixture can also include more than two mounting shafts and corresponding alignment shafts to accommodate connectors having more than four rows of leads.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A soldering fixture for coupling surface-mount leads of an edge connector to corresponding pads on a PCB, the soldering fixture comprising:
    a base for positioning over the edge connector;
    a threaded mounting shaft connected to the base and rotatable relative thereto;
    an alignment shaft threadably engaged with the threaded mounting shaft and connected to the base such that rotation of the threaded mounting shaft causes longitudinal movement of the alignment shaft relative to the threaded mounting shaft and the base; and
    an adjustment device connected to the threaded mounting shaft for rotating the threaded mounting shaft to move threads on the alignment shaft into engagement with the leads to move the leads into alignment with the pads.

2. The soldering fixture recited in claim 1, further comprising at least one retention device for applying a co-planar force between the base and the alignment shaft.

3. The soldering fixture recited in claim 1, further comprising first and second retention devices positioned at opposite ends of the base for applying a co-planar force between the base and the alignment shaft.

4. The soldering fixture recited in claim 3, wherein each retention device comprises:
    a pin having a head and a threaded shaft threadably engaged with the end connector; and
    a spring encircling the shaft and positioned between the head and the base for coupling each of the leads with the corresponding pads on the PCB by deflecting each of the leads towards the corresponding pads.

5. The soldering fixture recited in claim 1, wherein the adjustment device comprises a knob secured to the threaded mounting shaft for rotating the threaded mounting shaft about an axis to adjust a longitudinal position of the alignment shaft about an axis thereof.

6. The soldering fixture recited in claim 1, wherein the threads on the alignment shaft are helical.

7. The soldering fixture recited in claim 1, further comprising mounting blocks for receiving the edge connector to position the leads adjacent the threads on the alignment shaft.

8. The soldering fixture recited in claim 7, wherein each mounting block includes a first opening for rotatably receiving an end of the threaded mounting shaft and a second opening for slidably receiving an end of the alignment shaft.

9. The soldering fixture recited in claim 1, wherein at least one longitudinal side of the alignment shaft has a planar surface.

10. The soldering fixture recited in claim 1, further comprising an airflow plenum adaptor connected to the base for reflowing solder between the leads and the corresponding pads.

11. The soldering fixture recited in claim 1, further comprising a spacer connected to an end of the mounting shaft and cooperating with a planar surface on the alignment shaft to limit longitudinal movement of the alignment shaft.

12. The soldering fixture recited in claim 1, further comprising first and second pairs of mounting blocks connected to the base, the first pair of mounting blocks rotatably receiving the threaded mounting shaft and slidably receiving the alignment shaft, the second pair of mounting blocks rotatably receiving a second mounting shaft and slidably receiving a second alignment shaft threadably engaged with the second threaded mounting shaft such that rotation of the second threaded mounting shaft causes longitudinal movement of the second alignment shaft relative to the second threaded mounting shaft and the base, the second alignment shaft having threads movable into alignment with the leads.

13. The soldering fixture recited in claim 12, further comprising a second adjustment device connected to the second threaded mounting shaft for rotating the second threaded mounting shaft to move the threads on the second alignment shaft into engagement with the leads to move the leads into alignment with the pads.

14. The soldering fixture recited in claim 12, wherein the threaded mounting shaft and the second threaded mounting shaft are independently rotatable.

15. The soldering fixture recited in claim 12, further comprising:
a first spacer connected to an end of the mounting shaft and cooperating with a planar surface on the alignment shaft to limit longitudinal movement of the alignment shaft; and
a second spacer connected to an end of the second mounting shaft and cooperating with a planar surface on the second alignment shaft to limit longitudinal movement of the second alignment shaft.

16. A method of coupling surface-mount leads of an edge connector to corresponding pads on a PCB, the method comprising the steps of:
positioning a base of the soldering fixture over the edge connector, a threaded mounting shaft being connected to the base and being rotatable relative thereto, an alignment shaft being threadably engaged with the threaded mounting shaft and connected to the base such that rotation of the threaded mounting shaft causes longitudinal movement of the alignment shaft relative to the threaded mounting shaft and the base; and
rotating an adjustment device connected to the threaded mounting shaft to rotate the threaded mounting shaft and move threads on the alignment shaft into engagement with the leads to move the leads into alignment with the pads.

17. The method recited in claim 16, further comprising rotating at least one retention device connected to the base for applying a co-planar force between the base and the alignment shaft base to couple each lead with the correspond pad on the PCB by deflecting each lead towards the corresponding pad.

18. The method recited in claim 16, further comprising soldering the leads to the pads aligned therewith.

19. The method recited in claim 16, wherein the step of rotating the adjustment device comprises:
rotating the adjustment device in a first direction to move the threads on the alignment shaft in a first longitudinal direction to pre-stress the leads; and
rotating the adjustment device in a second direction opposite the first direction to move the threads on the alignment shaft in a second longitudinal direction opposite the first longitudinal direction to remove the pre-stress from the leads.

20. The method recited in claim 16, further comprising:
providing pre-tin on the lands;
connecting an airflow plenum adaptor to the base to position an elongated first passage of the adaptor into alignment with the pre-tin; and
blowing hot air into a second passage of the adaptor such that the hot air is passed through the first passage and uniformly distributed over the pre-tin.

21. The method recited in claim 16, wherein moving the threads on the alignment shaft simultaneously moves all the leads into alignment with the pads.

\* \* \* \* \*